(12) United States Patent
Colinge

(10) Patent No.: US 11,875,935 B2
(45) Date of Patent: Jan. 16, 2024

(54) INTEGRATED ELECTRONIC DEVICE COMPRISING A COIL AND METHOD FOR MANUFACTURING SUCH A DEVICE

(71) Applicant: COMMISSARIAT À L'ÉNERGIE ATOMIQUE ET AUX ÉNERGIES ALTERNATIVES, Paris (FR)

(72) Inventor: Jean-Pierre Colinge, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 399 days.

(21) Appl. No.: 17/101,573

(22) Filed: Nov. 23, 2020

(65) Prior Publication Data
US 2021/0159012 A1 May 27, 2021

(30) Foreign Application Priority Data
Nov. 25, 2019 (FR) ...................................... 1913151

(51) Int. Cl.
*H01F 41/24* (2006.01)
*H01F 17/00* (2006.01)
*H01F 27/32* (2006.01)
*H01L 49/02* (2006.01)

(52) U.S. Cl.
CPC ......... *H01F 41/24* (2013.01); *H01F 17/0013* (2013.01); *H01F 27/324* (2013.01); *H01L 28/10* (2013.01); *H01F 2017/0066* (2013.01)

(58) Field of Classification Search
CPC .... H01F 41/24; H01F 17/0013; H01F 27/324; H01F 2017/0066; H01L 28/10
See application file for complete search history.

(56) References Cited

U.S. PATENT DOCUMENTS

| 10,134,837 B1 | 11/2018 | Fanelli et al. |
| 2006/0157798 A1* | 7/2006 | Hayashi ............... H01L 27/0617 257/E29.022 |
| 2006/0255425 A1* | 11/2006 | Xie ....................... H01L 23/66 257/E29.295 |

(Continued)

FOREIGN PATENT DOCUMENTS

CN 106876440 A 6/2017
WO WO 2017/167923 A1 10/2017

OTHER PUBLICATIONS

Search Report as issued in French Patent Application No. 1913151, dated April 24, 2020.

(Continued)

*Primary Examiner* — Marlon T Fletcher
*Assistant Examiner* — Malcolm Barnes
(74) *Attorney, Agent, or Firm* — Pillsbury Winthrop Shaw Pittman LLP

(57) ABSTRACT

An electronic device includes a substrate; a porous semiconductor material layer arranged on the substrate; a first high magnetic permeability material arranged inside the pores of a first portion of the porous semiconductor layer, the first portion of the porous semiconductor material layer impregnated with the first high magnetic permeability material forming a first magnetic layer separated from the substrate by a second portion of the porous semiconductor material layer; and a coil arranged on the first magnetic layer.

13 Claims, 5 Drawing Sheets

(56) References Cited

U.S. PATENT DOCUMENTS

| | | | |
|---|---|---|---|
| 2008/0157911 A1* | 7/2008 | Fajardo | H01F 17/0006 |
| | | | 336/175 |
| 2012/0025345 A1 | 2/2012 | Botula et al. | |
| 2012/0235275 A1* | 9/2012 | Cheng | H01L 23/5227 |
| | | | 257/E29.325 |
| 2016/0284451 A1* | 9/2016 | Deligianni | H01F 5/00 |
| 2016/0307991 A1* | 10/2016 | Kuo | H01L 23/645 |
| 2017/0005111 A1 | 1/2017 | Verma et al. | |
| 2017/0323710 A1* | 11/2017 | Kim | H01F 1/0081 |
| 2018/0053784 A1 | 2/2018 | Cai et al. | |
| 2018/0083098 A1 | 3/2018 | Goktepeli | |
| 2018/0277632 A1* | 9/2018 | Fanelli | H01L 21/84 |
| 2018/0337043 A1 | 11/2018 | Englekirk et al. | |
| 2018/0358381 A1 | 12/2018 | Lamy et al. | |
| 2020/0321323 A1* | 10/2020 | Himeda | H02M 3/003 |

OTHER PUBLICATIONS

Zheng, H., et al., "Fabrication of CoFe2O4 ferrite nanowire arrays in porous silicon template and their local magnetic properties," Chin. Phys. B, vol. 25, No.2, (2016), pp. 026201-1-026201-5.

Chong, K., et al., "High-Performance Inductors Integrated on Porous Silicon," IEEE Electron Device Letters, vol. 26, No. 2, Feb. 2005, pp. 93-95.

Kononova, I. E., et al., "The preparation and properties of "porous silicon-nickel ferrite" nanoheterocomposites for gas detectors,"J. Sol.-Gel. Sci. Technol., (2014) vol. 71, pp. 234-240.

* cited by examiner

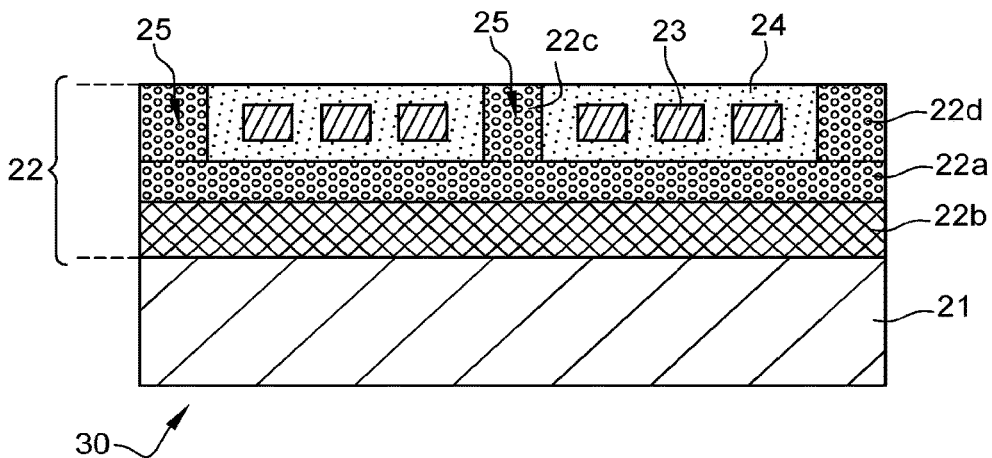
Fig. 4
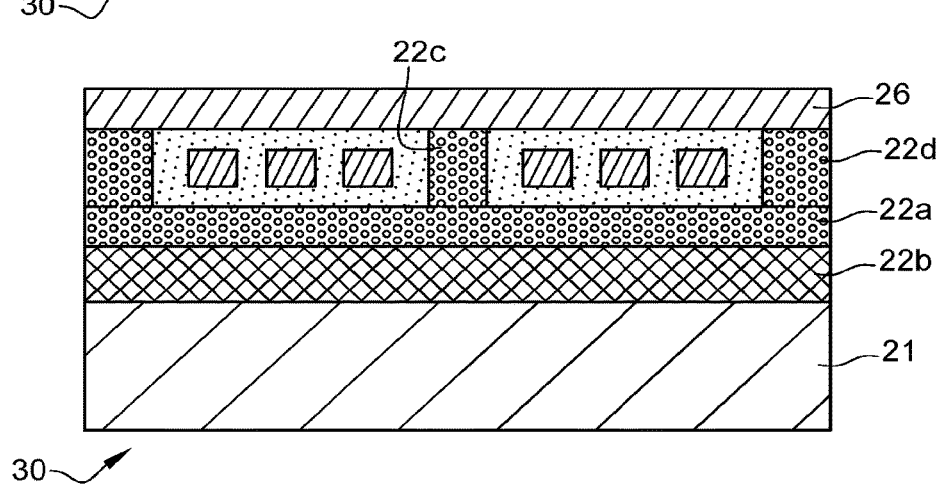
Fig. 5
Fig. 6
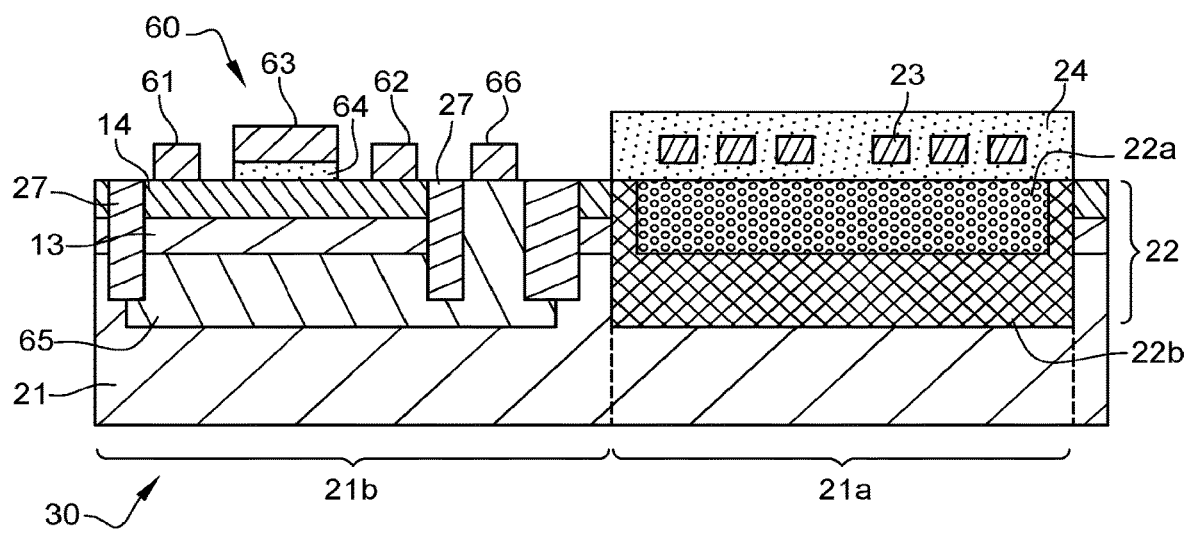

INTEGRATED ELECTRONIC DEVICE COMPRISING A COIL AND METHOD FOR MANUFACTURING SUCH A DEVICE

CROSS-REFERENCE TO RELATED APPLICATIONS

This application claims priority to French Patent Application No. 1913151, filed Nov. 25, 2019, the entire content of which is incorporated herein by reference in its entirety.

A. TECHNICAL FIELD

The present invention relates to integrated electronic devices manufactured from a substrate made from a semiconductor material, and more particularly to the on-chip inductors used for radiofrequency applications.

B. PRIOR ART

Various types of substrates can be used to manufacture integrated electronic circuits. The substrate is generally chosen according to the type of circuit to be manufactured: radiofrequency (RF) circuits, MOS transistor logic circuits, image sensors, etc.

Among the substrates of interest, mention can be made of the silicon on insulator (SOI) multilayer structure. The SOI multilayer structure successively comprises a support layer made from silicon, an electrically insulating layer, generally a buried oxide layer (BOX), and a thin film made from monocrystalline silicon, also called active layer. The active layer is named as such because it is intended to receive active components, typically MOS (Metal Oxide Semiconductor) transistors. The conduction channel of MOS transistors is formed in the active layer.

The SOI structure offers the possibility of manufacturing fully depleted transistors or FDSOI (Fully Depleted SOI). In order for an MOS transistor to be able to operate in fully depleted mode, the thickness of the silicon film has to be sufficiently low so that the depletion zone of the transistor reaches the buried oxide layer. The main advantages of the FDSOI technology are the improvement in the electrostatic control of the channel by the gate of the transistor, thus minimising the effects of short channels, and the possibility of modifying the threshold voltage of the transistors by polarising junctions that are located under the buried oxide layer.

[FIG. 1]: FIG. 1 shows another multilayer structure 10, derived from the SOI structure and commonly used for the manufacture of RF integrated circuits, such as the RF signal transmit-receive modules integrated into mobile phones (so-called "front-end" modules).

This multilayer structure 10, called "TR-SOI", successively comprises a support layer 11 made from high-resistivity silicon, a trap-rich layer 12, a buried oxide layer 13 and an active layer 14 made from monocrystalline silicon. The trap-rich layer 12 prevents the phenomenon of parasite conduction at the interface between the support layer 11 and the buried oxide layer 13, this phenomenon usually being caused by free electrons that accumulate at the interface under the effect of the fixed positive charges contained in the buried oxide layer 13. Thanks to the trap-rich layer 12, the electrons are trapped and can no longer circulate. The effective resistivity of the support layer 11 is thus increased with respect to a multilayer structure devoid of a trap-rich layer (structure called "HR-SOI"). The trap-rich layer 12 can be comprised of polycrystalline silicon. The traps are located at the grain boundaries of the polycrystalline silicon.

The structure TR-SOI 10 greatly improves the RF performance of the integrated circuits manufactured using this structure, in particular in terms of linearity and crosstalk. The passive elements (inductors, capacitors, etc.) formed above the active layer 14 benefit from a better quality factor.

The inductors or coils play a preponderant role in RF integrated circuits. They intervene in many functions, such as impedance matching, filtering and the amplification of RF signals. They occupy a substantial portion of the surface area of circuits.

[FIG. 2]: In reference to FIG. 2, the document ["High-Performance Inductors Integrated on Porous Silicon", IEEE Electron Device Letters, Vol. 26, No. 2, 2005] describes an integrated electronic device 20 comprising a substrate 21 made from highly-doped p-type silicon (and therefore of low resistivity), a porous silicon layer 22 arranged on the substrate 21 and a planar coil 23 spirally wound and arranged on the porous silicon layer 22. The porous silicon layer 22 is formed by anodising of a surface region of the substrate 21. Dielectric layers 24a-24b separate the coil 23 from the porous silicon layer 22.

The porous silicon layer 22 improves the quality factor Q (by reducing in particular the losses through the Joule effect caused by the eddy currents) and the resonance frequency $f_r$ of the coil 23. On the other hand, it has no impact on the (series) inductance Ls of the coil. According to the document, a high-inductance coil can be obtained only by increasing the dimensions of the coil (including the number of turns) and therefore the surface area (or footprint) of the coil. This results in an increase in the size of the RF circuit wherein the coil 23 is integrated.

C. SUMMARY OF THE INVENTION

The invention has for purpose to improve the performance of an on-chip inductor without however increasing its size.

According to a first aspect of the invention, this objective is contributed to by providing an integrated electronic device comprising:
  a substrate;
  a porous semiconductor material layer arranged on the substrate;
  a first high magnetic permeability material arranged inside the pores of a first portion of the porous semiconductor layer, the first portion of the porous semiconductor material layer impregnated with the first high magnetic permeability material forming a first magnetic layer separated from the substrate by a second portion of the porous semiconductor material layer; and
  a coil arranged on the first magnetic layer.

The magnetic permeability ($\mu$) characterises the faculty of a material to modify a magnetic field, i.e. to modify/direct the magnetic field lines. Hereinabove "high magnetic permeability material" refers to a material that has a magnetic permeability greater than $100 \times \mu_0$, where $\mu_0$ is the permeability of the vacuum ($\mu_0 = 4\pi \times 10^{-7}$ H/m), that is to say a magnetic permeability greater than that of carbon steel.

The first magnetic layer, comprising the porous semiconductor material and the first high magnetic permeability material, increases the inductance of the coil by channelling the magnetic field lines. The introduction of the first high magnetic permeability material in a portion of the porous semiconductor material layer avoids superimposing a magnetic core on the porous semiconductor material layer, thus limiting the size of the integrated electronic device. The second portion of the porous semiconductor material layer forms an electron-confinement layer, which substantially limits the eddy currents in the substrate, and consequently the resistive losses by the Joule effect.

Preferably, the coil is planar and spirally wound.

In an embodiment of the integrated electronic device, the first high magnetic permeability material is furthermore arranged inside the pores of a third portion of the porous semiconductor material layer and of a fourth portion of the porous semiconductor material layer, the third portion being located at the centre of the coil and the fourth portion being located at the periphery of the coil.

In another embodiment, the integrated electronic device further comprises a second magnetic layer arranged on the coil, the second magnetic layer comprising a second high magnetic permeability material.

According to a development of this embodiment, the first high magnetic permeability material and the second high magnetic permeability material are identical.

The integrated electronic device according to the first aspect of the invention can also have one or more of the characteristics hereinbelow, taken individually or in any technically permissible combination:
- the pores of the second portion are devoid of electrically conductive material;
- the pores of the second portion are void or filled with air;
- the porous semiconductor material layer and the coil are supported by a first region of the substrate, the device further comprising an active component, such as a back-gate transistor, supported by a second region of the substrate, distinct from the first region;
- the porous semiconductor material layer has a thickness comprised between 0.2 μm and 2 μm;
- the second portion of the porous semiconductor material layer has a thickness comprised between 10 nm and 1 μm;
- the substrate is made from a high-resistivity semiconductor material; and
- the porous semiconductor material is porous silicon or a porous silicon-germanium alloy.

A second aspect of the invention relates to a method for manufacturing an integrated electronic device. This manufacturing method comprising the following steps:
- forming a porous semiconductor material layer on a substrate;
- forming a first magnetic layer by filling the pores of a first portion of the porous semiconductor material layer with a first high magnetic permeability material, the first magnetic layer being separated from the substrate by a second portion of the porous semiconductor material layer; and
- forming a coil on the first magnetic layer.

In an embodiment, the manufacturing method further comprises a step of etching the first magnetic layer in such a way as to form an annular cavity, the coil being formed on the first magnetic layer in the annular cavity.

In another embodiment, the manufacturing method further comprises a step of depositing a second magnetic layer on the coil.

The second magnetic layer is preferably in contact with the first magnetic layer.

A third aspect of the invention relates to an integrated electronic device able to be obtained by the method of manufacturing fabrication according to the second aspect of the invention.

In an embodiment, the integrated electronic device comprises an active component, such as a back-gate transistor, located at the same level as the porous semiconductor material layer.

D. BRIEF DESCRIPTION OF THE FIGURES

Other characteristics and advantages of the invention will clearly emerge from the description which is given of it hereinbelow, for the purposes of information and is in no way limiting, in reference to the accompanying figures, among which:

FIG. 1, previously described, shows a multilayer structure according to the prior art, used as a starting substrate for the manufacture of radiofrequency integrated circuits;

FIG. 2, previously described, shows an integrated electronic device according to the prior art, comprising a coil on a porous silicon layer;

FIG. 4 shows a second embodiment of the integrated electronic device according to the first aspect of the invention;

FIG. 5 shows a third embodiment of the integrated electronic device according to the first aspect of the invention;

FIG. 6 shows a fourth embodiment of the integrated electronic device according to the first aspect of the invention;

For increased clarity, identical or similar elements are marked with identical reference signs on all the figures.

E. DETAILED DESCRIPTION

Figure 1:
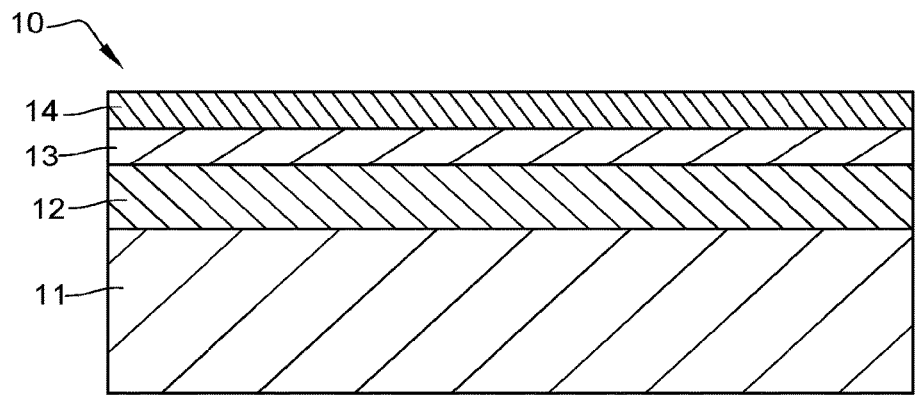
Figure 2:
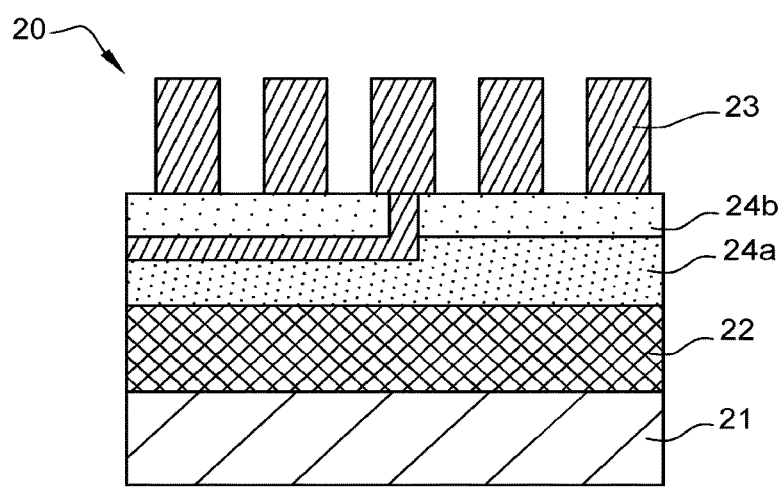
Figure 3:
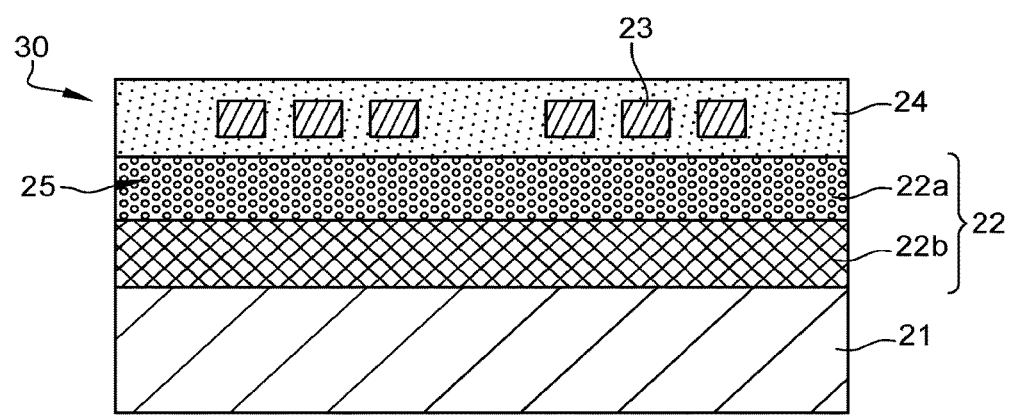
FIG. 3 shows a first embodiment of an integrated electronic device according to the first aspect of the invention.

[FIG. 3]: FIG. 3 is a schematic cross-section view of an integrated electronic device 30 according to a first embodiment of the invention.

The integrated electronic device 30 comprises a substrate 21, a porous semiconductor material layer 22 arranged on the substrate 21 and at least one coil 23 arranged on the porous semiconductor material layer 22.

The substrate 21 (also called support layer) is preferably formed from a high resistivity semiconductor material, for example high resistivity silicon. A semiconductor material is here qualified as high resistivity when its electrical resistivity is greater than or equal to 1000 Ω·cm. Such a resistivity makes it possible to reduce the leakage current between the various components (active or passive) formed on the substrate and the eddy currents in the substrate, thus limiting the losses by the Joule effect that stem from it.

The porous semiconductor material layer 22 preferably has a thickness comprised between 0.2 μm and 2 μm. Such a thickness facilitates the integration of the integrated electronic device 30 and reduces the risk of deformation of the substrate (phenomenon of plate curvature called "bow"). The porous semiconductor material is for example porous silicon or a porous silicon-germanium alloy ($Si_xGe_{1-x}$).

A high magnetic permeability material 25 is arranged inside the pores of a first so-called "upper" portion 22a of the porous semiconductor material layer 22. This high magnetic permeability material 25 is preferably a ferromagnetic material, for example ferrite. Ferrite is an iron oxide ferromagnetic ceramic that can comprise one or more other metals, such as lead (lead ferrite), manganese (manganese ferrite), cobalt (cobalt ferrite) and nickel (nickel ferrite).

The porosity of the semiconductor material is advantageously comprised between 20% and 80%. The higher the degree of porosity is, the easier it is to fill the pores with high magnetic permeability material, but the weaker the semiconductor material is and the greater the risk of deformation (bow) of the substrate becomes. The diameter of the pores is preferably comprised between 10 nm and 50 nm.

The first portion 22a of the porous semiconductor material layer 22, impregnated with the high magnetic permeability material 25, forms a first magnetic layer. This first magnetic layer increases the inductance value of the coil 23, by channelling a part of the lines of the magnetic field produced by the coil 23. It is consequently possible to obtain a coil with higher inductance for the same surface area or to reduce the surface area of the coil for a given inductance value.

The first portion 22a of the porous semiconductor material layer 22 is separated from the substrate 21 by a second so-called "lower" portion 22b of the porous semiconductor material layer 22. The pores of this second portion 22b are devoid of electrically conductive material, in particular of high magnetic permeability material (the pores of the semiconductor material are more preferably void or filled with air). It constitutes an electron-confinement layer, i.e. a layer wherein the movement of the electrons is inhibited. The distance over which the electrons can move therein is very small, typically about the distance between the pores, which is about 10 nm to 50 nm. The eddy currents cannot be generated in the confinement layer 22, while those of the underlying substrate 21 remain limited. The thickness of the confinement layer 22b preferably represents between 30% and 70% of the thickness of the porous semiconductor material layer 22. By way of example, the thickness of the confinement layer 22b is comprised between 10 nm and 1 µm.

The coil 23 is preferably a planar spirally-wound coil. Alternatively, it can comprise several spirals arranged on one another.

The coil 23 is advantageously separated from the first magnetic layer by a dielectric layer. This dielectric layer prevents leakage current through the high magnetic permeability material 25 which fills in the pores of the porous semiconductor material. Preferably, the coil 23 is coated with a dielectric material 24, for example silicon dioxide ($SiO_2$) or silicon nitride ($Si_3N_4$). Only vias and/or interconnection lines (not shown in FIG. 3) pass through this dielectric material 24 to supply the coil 23 with electrical energy.

Thus, in this first embodiment, the porous semiconductor material layer 22 is divided in its thickness into two superimposed portions 22a-22b. The first portion 22a impregnated with the high magnetic permeability material 25 forms an open magnetic circuit arranged only under the coil 23.

[FIG. 4]: FIG. 4 shows a second embodiment of the integrated electronic device 30, wherein the coil 23 is buried in the porous semiconductor material layer 22. The high magnetic permeability material 25 fills the pores of a third portion 22c of the porous semiconductor material layer 22 located at the centre of the coil 23 and the pores of a fourth portion 22d of the porous semiconductor material layer 22 located at the periphery of the coil 23. The third portion 22c and the fourth portion 22d impregnated with the magnetic permeability material 25 respectively form a magnetic core and a magnetic ring. The magnetic core and the magnetic ring are thus comprised of the same "composite" material as the first magnetic layer and extend the first magnetic layer. They have for effect to further increase the inductance of the coil 23, by further channelling the field lines. They more preferably have a symmetrical shape in relation to a central axis of the coil 23.

[FIG. 5]: FIG. 5 shows, still as a schematic cross-section view, a third embodiment of the integrated electronic device 30. This third embodiment differs from the second embodiment (cf. FIG. 4) in that it further comprises a second magnetic layer 26 arranged on the coil 23. The second magnetic layer 26 thus forms with the first magnetic layer, the magnetic core and the magnetic ring a closed magnetic circuit that entirely surrounds the coil and passes through its centre. The inductance of the coil 23 is thus maximised.

Contrary to the first magnetic layer, which comprises the porous semiconductor material and the high magnetic permeability material 25 arranged inside pores of the porous semiconductor material, the second magnetic layer 26 can be comprised only of high magnetic permeability material or materials (more preferably a ferromagnetic material, such as ferrite). To simplify the manufacturing of the integrated electronic device 30 (and reduce the costs of this manufacturing), the high magnetic permeability material of the second magnetic layer 26 and the high magnetic permeability material 25 of the first magnetic layer can be identical.

[FIG. 6]: In a fourth embodiment shown in FIG. 6, the porous semiconductor material layer 22 and the coil 23 are supported by a first region 21a of the substrate 21.

The substrate 21 can belong to a multilayer structure comprising (furthermore) an electrically insulating layer 13 arranged on the substrate 21 and an active layer 14 arranged on the electrically insulating layer 13. The active layer 14 is preferably a thin film of semiconductor material, intrinsic or doped, for example made from monocrystalline silicon, germanium, silicon-germanium alloy or a III-V semiconductor material. The electrically insulating layer 13 can be a so-called buried oxide layer (as it is buried under the active layer 14), for example made from silicon dioxide ($SiO_2$), or a layer of any other dielectric material, for example made from silicon nitride, a "high-k" dielectric material or alumina ($Al_2O_3$).

A second region 21b of the substrate 21, distinct from the first region 21a, supports an active component, for example a back-gate MOS transistor 60. A "back-gate MOS transistor" is an MOS transistor that comprises a conduction channel, an electrically conductive layer separated from the conduction channel by the electrically insulating layer, here the buried oxide layer (BOX).

The transistor MOS 60 comprises a conduction channel, a drain region and a source region, all three formed in the active layer 14. The conduction channel separates the drain region and the source region. The conduction channel, the drain region and the source region together form the active zone of the transistor, which can be delimited by shallow isolation trenches 27. The active layer 14 is topped by a drain electrode 61 (in contact with the drain region), a source electrode 62 (in contact with the source region) and a gate electrode 63. The gate electrode 63 is separated from the conduction channel by a gate dielectric 64, typically an oxide.

The transistor MOS 60 further comprises a back gate 65, also called well or ground plane. The back gate 65 is an electrically conductive layer that extends at least in part under the electrically insulating layer 13 (and the conduction channel of the transistor) and which makes it possible to modify the threshold voltage of the transistor. The back gate 65 can be biased at a positive or negative voltage, for example thanks to a back gate contact 66 located at the same level as the drain and source electrodes 61-62. The thickness of the electrically insulating layer 13 is preferably less than 30 nm, so as to optimise the electrostatic control of the conduction channel by the back gate 65.

The back-gate MOS transistor 60 is preferably of the FDSOI type, i.e. a transistor operating in a fully depleted mode and manufactured from a multilayer structure SOI (silicon insulator) comprising a substrate 21 made from high-resistivity silicon (HR-SOI). The thickness of the active layer 14 is preferably less than 15 nm.

In FIG. 6, a single back-gate MOS transistor 60 and a single coil 23 were shown. However, the first region 21a of the substrate 21 can support several passive components (of which at least one coil 23) and the second region 21b of the substrate 21 can support several back-gate MOS transistors 60, of the same type as the one described hereinabove.

The back-gate MOS transistors 60 belong preferably to a logic (integrated) circuit, for example a microprocessor. A logic circuit designates a circuit that is able to fulfil one or more logic functions, for example calculations.

The passive components belong preferably to a radiofrequency (RF) (integrated) circuit, for example a "front-end" transmit-receive module. They have for purpose to generate or process (e.g. filter, amplify, etc.) RF signals. An RF circuit designates a circuit capable of fulfilling one or several communication functions (e.g.: wireless technologies Wi-Fi, Bluetooth, LTE, etc.).

Thus, in this integrated electronic device referred to as "hybrid" shown in FIG. 6, the first region 21a of the substrate 21 is dedicated to passive components (coils, capacitors, transmission lines, etc.) while the second region 21b of the substrate 21 is reserved for active components. The active components, more particularly the back-gate transistors, are preferably located at the same level as the porous semiconductor material layer 22, i.e. on the same plane (in other words, at the same height in a direction perpendicular to the substrate 21).

In a way common to all the embodiments, the integrated electronic device 30 can comprise several coils 23 which share the same magnetic circuit (open or closed) or each be equipped with a separate magnetic circuit. Several separate regions of the porous semiconductor material layer 22 can therefore be impregnated with high magnetic permeability material. The high magnetic permeability material can be different from one region to another.

FIGS. 7A to 7D show steps of a method for manufacturing the integrated electronic device 30 according to FIG. 3.

The first step of this manufacturing method consists of forming the porous semiconductor material layer 22 on the substrate 21.

Figure 7A:
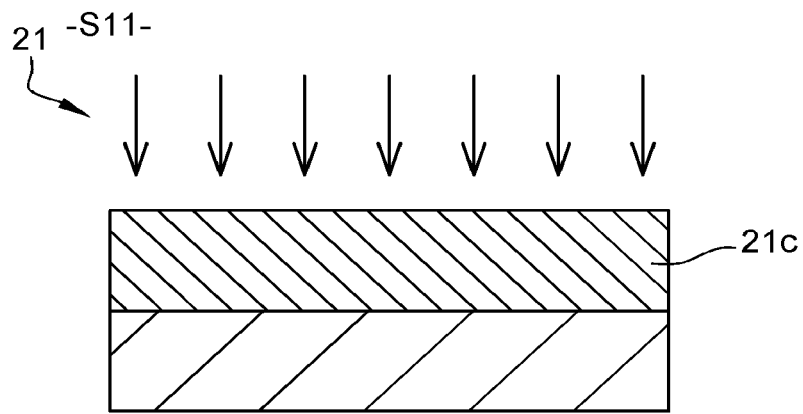
FIGS. 7A to 7D show steps of a method for manufacturing the integrated electronic device according to FIG. 3.
Figure 7B:
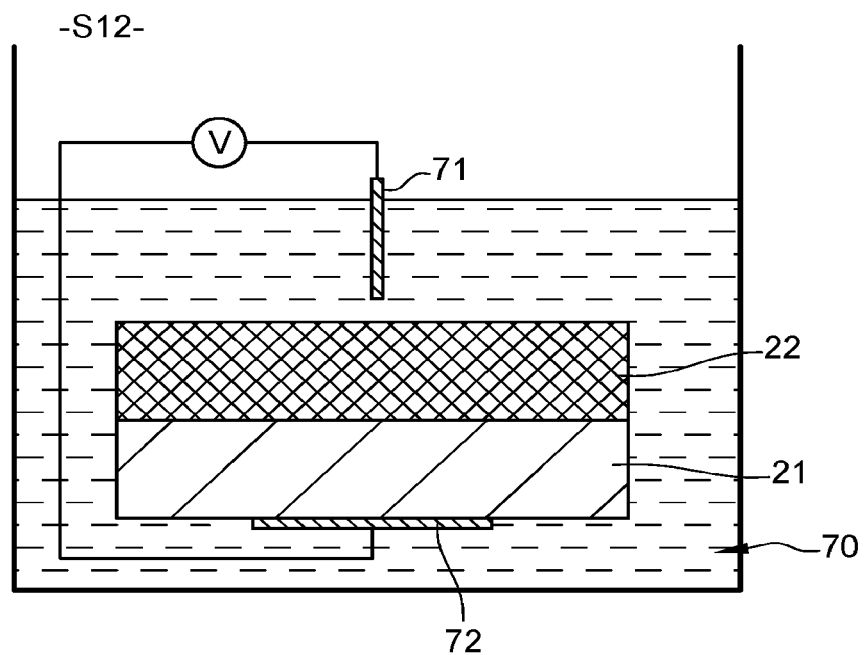

In an embodiment of the manufacturing method, the formation of the porous semiconductor material layer 22 comprises two substeps S11 and S12 shown respectively in FIGS. 7A and 7B.

[FIG. 7A]: During the first substep S11, a surface region 21c of the substrate 21, comprising the front face of the substrate 21, is p-type doped or highly n-type doped. In the case of a p-type doping, the concentration in doping impurities (e.g. boron atoms) in the surface region 21c is advantageously greater than $10^{16}$ cm$^{-3}$. In the case of an n-type doping, the concentration in doping impurities (e.g. phosphorous or arsenic atoms) in the surface region 21c is greater than $10^{18}$ cm$^{-3}$.

[FIG. 7B]: Then, during the second substep S12, the doped surface region 21c is made porous by anodic dissolution. The anodic dissolution, also called anodising, consists of immersing the substrate 21 into an electrolyte 70, for example with a hydrofluoric acid (HF) base, while still applying an electric field. The electric field can be generated using two electrodes: a first electrode 71 immersed in the electrolyte 70 and a second electrode 72 in contact with the substrate 21, for example arranged against the rear face of the substrate 21 (the rear face being located opposite to the front face and therefore to the surface region 21c). The other regions of the substrate, which can be protected by a mask or lightly n-type doped, are not affected by the anodising process and therefore are not transformed into porous layers.

In an alternative embodiment not shown in the figures, a layer of semiconductor material that is p-type doped or highly n-type doped is deposited on the substrate 21, then made porous via anodic dissolution.

Figure 7C:
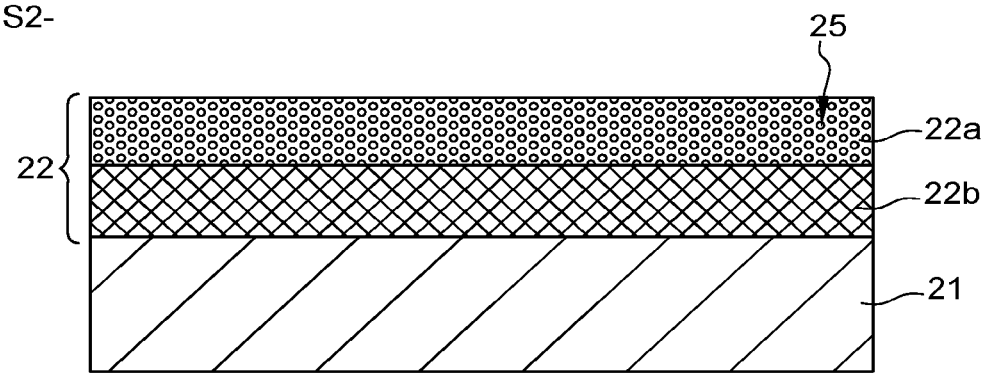

[FIG. 7C]: In reference to FIG. 7C, the manufacturing method then comprises a step S2 of forming the first magnetic layer, by deposition of the high magnetic permeability material 25 in the first portion 22a of the porous semiconductor material layer 22. The high magnetic permeability material 25 can be introduced inside the pores of the porous semiconductor material by electrodeposition or atomic layer deposition (ALD). The electrodeposition is carried out in a liquid solution containing the ions to be deposited. With the ALD technique, a succession of gas pulses is produced containing precursors which chemically react with the surface of the porous material in order to deposit therein the desired chemical compound. The pores are more preferably entirely filled with the high magnetic permeability material 25.

Figure 7D:
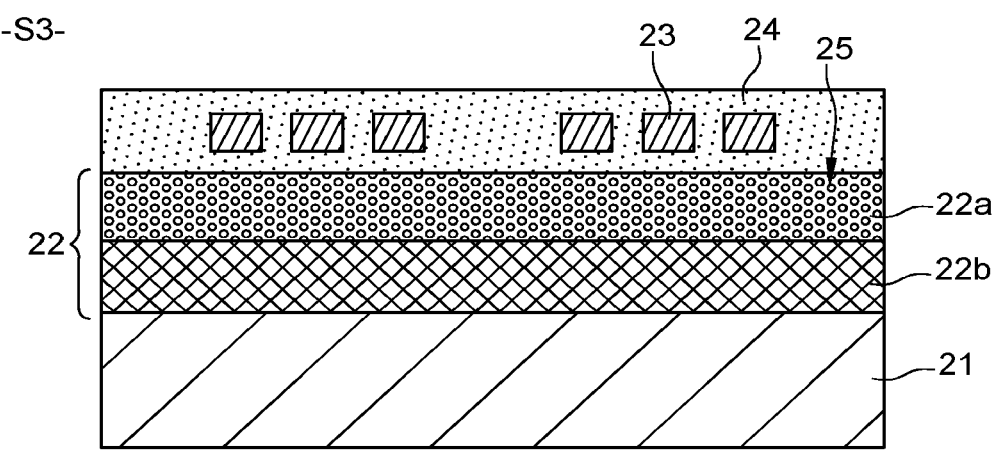

[FIG. 7D]: Finally, in the step S3 of FIG. 7D, the coil 23 is formed on the first magnetic layer. The formation of the coil 23 preferably comprises substep of depositing a metal layer and a substep of structuring the metal layer, for example by photolithography then etching.

The formation of the coil 23 can be preceded by a first deposition of dielectric material 24 (ex. $SiO_2$, $Si_3N_4$ . . . ) and followed by a second deposition of dielectric material 24 (ex. $SiO_2$, $Si_3N_4$ . . . ), so as to coat (or "encapsulate") the coil 23 and electrically insulate it from the first magnetic layer.

Figure 8D:
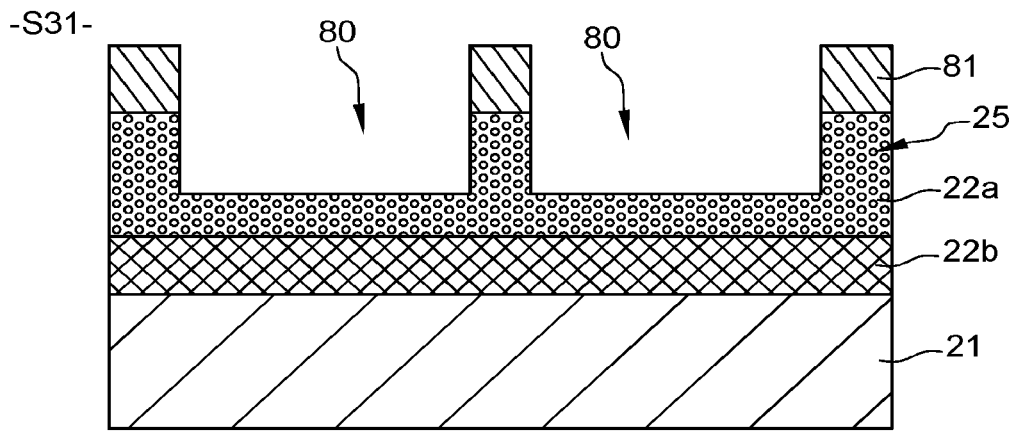
FIGS. 8D and 8E show manufacturing steps that follow the step of FIG. 7C and making it possible to obtain the integrated electronic device of FIG. 4.
Figure 8E:
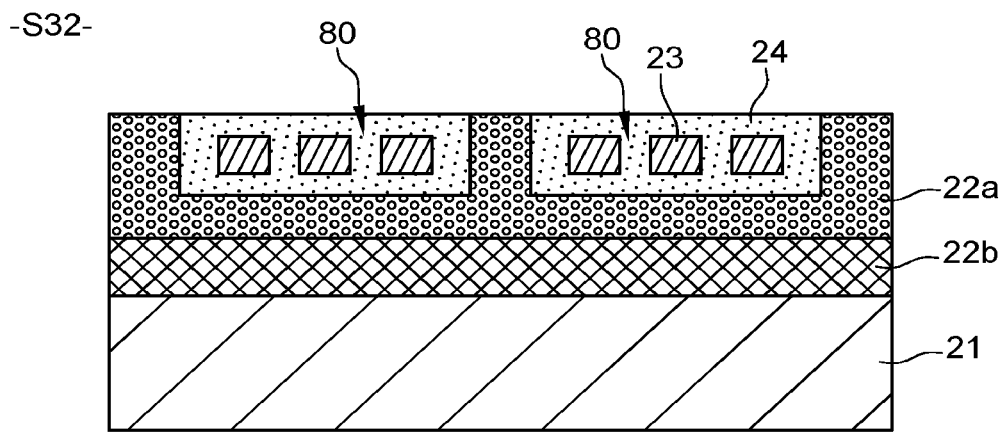

FIGS. 8D and 8E show manufacturing steps S31 and S32 which, when they replace the step S3 of FIG. 7D, make it possible to obtain the integrated electronic device 30 of FIG. 4.

[FIG. 8D]: The step S31 of FIG. 8D consists of etching the first magnetic layer (i.e. the first portion 22a of the porous semiconductor material layer after it has been filled with the high magnetic permeability material 25), in such a way as to form an annular cavity 80. The etching can be accomplished through a mask 81 that comprises a recess (i.e. an opening) of annular shape. The first magnetic layer is etched only over a portion of its thickness. The bottom of the cavity 80 is therefore constituted by a remaining portion of the first magnetic layer.

[FIG. 8E]: In the step S32 of FIG. 8E, the coil 23 is then formed on the remaining portion of the first magnetic layer, inside the annular cavity 80. The coil 23 can be formed during the step S32 before or after removal of the mask 81, more preferably in the way described in relation with FIG. 7D.

Figure 9F:
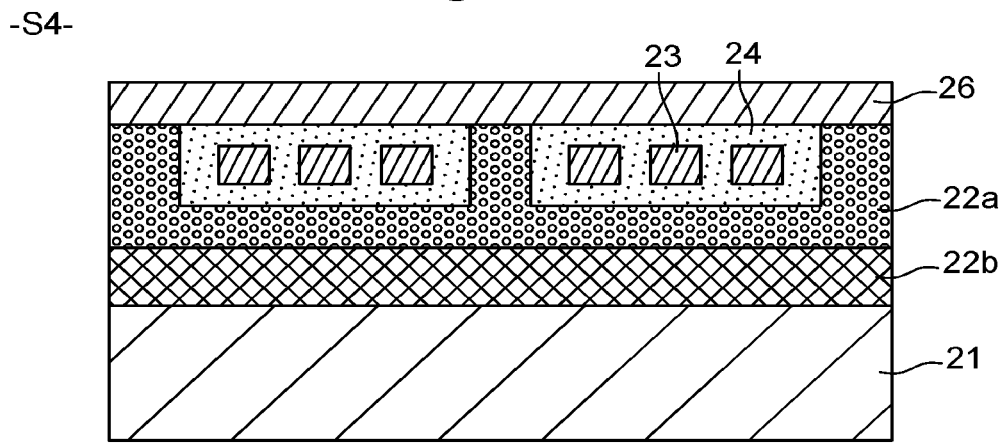
FIG. 9F shows an additional manufacturing step that follows the step of FIG. 8E and making it possible to obtain the integrated electronic device of 5.

[FIG. 9F]: FIG. 9F shows an additional step S4 that can be accomplished after the step S32 of FIG. 8E to obtain the integrated electronic device 30 of FIG. 5 or after the step S3 of FIG. 7D. This additional step S4 consists of depositing the second magnetic layer 26 on the coil 23. The second magnetic layer 26 comprises a second high magnetic permeability material, which can be deposited via cathode sputtering, ALD, electron beam evaporation . . . The deposition conditions of the second high magnetic permeability material can be identical to those of the (first) high magnetic permeability material 25.

The manufacturing method described hereinabove in relation with FIGS. 7 to 9 is simple to implement and easy to industrialise, because it makes use of techniques that are commonly used in microelectronics. It is moreover compatible with the manufacturing methods of the CMOS technology (acronym for "Complementary Metal Oxide Semiconductor").

Thus, to manufacture the "hybrid" integrated electronic device of FIG. 6, the steps described hereinabove (except possibly the step of doping the surface region 21c) can be accomplished after the formation of the back-gate MOS transistor 60 in the second region 21b of the substrate 21, by having covered beforehand the second region 21b with a hard mask, for example made from silicon nitride.

The formation of the MOS transistor 60 comprises in particular (cf. FIG. 6) the formation of the well or back gate 65 in the multilayer structure, the formation of the shallow insulation trenches 27 in the multilayer structure (so as to delimit the active zone of the transistor in the active layer 14), the formation of a gate structure on the active layer 14 (the gate structure comprising a gate electrode 63 and a gate dielectric 64), the doping of the active layer to form drain regions and source regions (not shown in FIG. 6), the formation of a drain electrode (or contact) 61, of a source electrode (or contact) 62 and of a back-gate contact 66 on the active layer 14. The formation of the MOS transistor 60 can also comprise a step of epitaxy on the drain and source regions in order to reduce the resistance of the source and drain contacts. As the steps of manufacturing a back-gate (or double gate) MOS transistor are known, they will not be described in any further detail here.

The well 65 (or back gate) is preferably formed by implanting dopants (of the n or p type, according to the type of MOS transistor to be manufactured) in a portion of the substrate 21, through the electrically insulating layer 13 and the active layer 14.

The doping of the surface region 21c of the substrate 21 is advantageously carried out at the same time, immediately before or immediately after the doping by ion implantation of the well 65. It can be advantageous for the doped surface region 21c (intended to form the porous semiconductor material layer 22) to be thicker than the well 65. The dopants of the surface region 21c will then be implanted more deeply, for example by providing at least one additional step of ion implantation having an dopant implantation profile different from that of the well 65.

The steps of doping (for example by ion implantation) are followed by a step of diffusion of the dopants. This step of diffusion of dopants is generally carried out by annealing, at a temperature comprised between 900° C. and 1150° C. As such a temperature can be detrimental for the MOS transistor, the steps of doping and of diffusion of the dopants of the well 65 and of the surface region 21c are advantageously accomplished at the beginning of the method of manufacturing.

The integrated electronic device and the method for manufacturing thereof are not limited to the embodiments described hereinabove in relation with the figures. Many alternatives and modifications shall appear to those skilled in the art. For example, devices such as resistors, bipolar transistors or ESD (electrostatic discharge) protective diodes can furthermore be manufactured in the substrate 21 and other devices such as LDMOS (Laterally-diffused metal-oxide semiconductor) power transistors can be manufactured in the active layer 14.

The invention claimed is:

1. An electronic device comprising:
a substrate;
a porous semiconductor material layer arranged on the substrate;
a first high magnetic permeability material arranged inside the pores of a first portion of the porous semiconductor layer, the first portion of the porous semiconductor material layer impregnated with the first high magnetic permeability material forming a first magnetic layer separated from the substrate by a second portion of the porous semiconductor material layer, the pores of the second portion being devoid of electrically conductive material; and
a coil arranged on the first magnetic layer.

2. The electronic device according to claim 1, wherein the coil is planar and spirally wound.

3. The electronic device according to claim 1, wherein the first high magnetic permeability material is furthermore arranged inside the pores of a third portion of the porous semiconductor material layer and of a fourth portion of the porous semiconductor material layer, the third portion being located at the centre of the coil and the fourth portion being located at the periphery of the coil.

4. The electronic device according to claim 1, further comprising a second magnetic layer arranged on the coil, the second magnetic layer comprising a second high magnetic permeability material.

5. The electronic device according to claim 4, wherein the first high magnetic permeability material and the second high magnetic permeability material are identical.

6. The electronic device according to claim 1, wherein the porous semiconductor material layer and the coil are supported by a first region of the substrate, the device further comprising an active component supported by a second region of the substrate, distinct from the first region.

7. The electronic device according to claim 1, wherein the porous semiconductor material layer has a thickness comprised between 0.2 µm and 2 µm.

8. The electronic device according to claim 1, wherein the second portion of the porous semiconductor material layer has a thickness comprised between 10 nm and 1 µm.

9. The electronic device according to claim 1, wherein the substrate is made from a high-resistivity semiconductor material.

10. The electronic device according to claim 1, wherein the pores of the second portion are void or filled with air.

11. A method for manufacturing an electronic device, comprising:
forming a porous semiconductor material layer on a substrate;
forming a first magnetic layer by filling the pores of a first portion of the porous semiconductor material layer with a first high magnetic permeability material, the first magnetic layer being separated from the substrate by a second portion of the porous semiconductor material layer, the pores of the second portion being devoid of electrically conductive material; and forming a coil on the first magnetic layer.

12. The method according to claim 11, further comprising a step of etching the first magnetic layer in such a way as to form an annular cavity, the coil being formed on the first magnetic layer in the annular cavity.

13. The method according to claim 11, further comprising a step of depositing a second magnetic layer on the coil.

* * * * *